US012805064B2

(12) United States Patent
Yan et al.

(10) Patent No.: US 12,805,064 B2
(45) Date of Patent: Nov. 17, 2026

(54) SOLAR CELL

(71) Applicant: SUZHOU MAXWELL TECHNOLOGIES CO., LTD., Suzhou (CN)

(72) Inventors: Weijia Yan, Suzhou (CN); Jing Zheng, Suzhou (CN); Jianming Yan, Suzhou (CN); Wei Li, Suzhou (CN)

(73) Assignee: SUZHOU MAXWELL TECHNOLOGIES CO., LTD., Suzhou (CN)

( * ) Notice: Subject to any disclaimer, the term of this patent is extended or adjusted under 35 U.S.C. 154(b) by 0 days.

(21) Appl. No.: 19/073,063

(22) Filed: Mar. 7, 2025

(65) Prior Publication Data

US 2026/0075987 A1 Mar. 12, 2026

(30) Foreign Application Priority Data

Sep. 6, 2024 (CN) ........................ 202422184256.4

(51) Int. Cl.
*H10F 77/00* (2025.01)
*H10F 19/90* (2025.01)

(52) U.S. Cl.
CPC ......... *H10F 77/935* (2025.01); *H10F 19/904* (2025.01)

(58) Field of Classification Search
CPC ...... H10F 19/90; H10F 19/902; H10F 19/904; H10F 77/935
See application file for complete search history.

(56) References Cited

U.S. PATENT DOCUMENTS

2017/0040481 A1* 2/2017 Cho ...................... H10F 19/904

FOREIGN PATENT DOCUMENTS

CN 112510107 A * 3/2021 ........... H10F 77/488

OTHER PUBLICATIONS

CN 112510107 A English Translation provided by FIT database, translated on Apr. 18, 2026.*

* cited by examiner

*Primary Examiner* — Golam Mowla
(74) *Attorney, Agent, or Firm* — PORUS IP LLC

(57) ABSTRACT

The present disclosure relates to the technical field of solar cells, and provides a solar cell. The solar cell may include a plurality of cells and a plurality of ribbons. Each cell includes a plurality of grid line sets arranged side by side along a first preset direction, each grid line set includes a plurality of grid lines of a preset length arranged in parallel along a second preset direction, and the grid lines in two adjacent grid line sets are disconnected, where the first preset direction is perpendicular to the second preset direction. Each ribbon connects the plurality of cells to one another in series and is soldered to all the grid lines in one grid line set of one cell. According to the present disclosure, the plurality of grid line sets are disposed at the cell, and the grid lines between the grid line sets are disconnected from each other, which can save an amount of grid line paste and costs. In addition, compared with continuous grid lines, the disconnected grid lines between the grid line sets reduce shielding of the cell, and increase a light absorption area of the cell, thereby improving the performance of the cell.

9 Claims, 4 Drawing Sheets

SOLAR CELL

CROSS-REFERENCE TO RELATED APPLICATIONS

This application claims priority to Chinese Patent Application No. 202422184256.4, filed on Sep. 6, 2024, the contents of each of which are hereby incorporated by reference.

TECHNICAL FIELD

The present disclosure relates to the technical field of solar cell manufacturing, in particular to a solar cell.

BACKGROUND OF THE INVENTION

During manufacturing of solar cells, cells need to be soldered by ribbons after being fabricated. Generally speaking, when few ribbons are used for the cells, there is a long distance between the ribbons, resulting in a long path for carriers to converge on the ribbons and high possibility of an electron loss. When a large number of ribbons are used for the cells, the ribbons cause significant shielding to the cells, which is not conducive to the efficiency of the cells. In the prior art, mostly no more than 28 ribbons (as shown in FIG. 1) are disposed at continuous grid lines. In FIG. 1, the continuous grid lines 1 are located in a transverse direction, and the 28 ribbons 2 are located in a longitudinal direction. No more than 28 ribbons are disposed in the prior art to achieve a relative balance between the shielding of the cells by the ribbons and the electron loss. In this way, the performance of the cells cannot be further improved.

SUMMARY

An objective of a first aspect of the present disclosure is to provide a solar cell, which solves the problem in the prior art that the performance of cells is limited.

Particularly, the present disclosure provides a solar cell, including:

- a plurality of cells, where each of the cells includes a plurality of grid line sets arranged side by side along a first preset direction, each of the grid line sets includes a plurality of grid lines of a preset length arranged in parallel along a second preset direction, and the grid lines in adjacent two of the grid line sets are disconnected, where the first preset direction is perpendicular to the second preset direction; and
- a plurality of ribbons, where each of the ribbons connects the plurality of cells to one another in series and is soldered to all the grid lines in one of the grid line sets of one of the cells.

Optionally, the number of the grid line sets on each of the cells is the same as the number of the ribbons.

Optionally, the number of the ribbons at each of the cells is greater than 28 and less than or equal to 78.

Optionally, the ribbon is soldered in middles of the grid lines in the corresponding grid line set.

Optionally, the ribbon is a special-shaped ribbon, the special-shaped ribbon includes a special-shaped segment and a flat segment, and the special-shaped segment is soldered to the grid line set.

Optionally, a section of the special-shaped segment of the special-shaped ribbon is in a shape of a triangle, and a base of the triangle is soldered to the grid line.

Optionally, the triangle is an equilateral triangle; and a side length of the equilateral triangle is 0.15 mm.

Optionally, the ribbon includes an internal core layer and an external plating.

Optionally, a section of the internal core layer is formed in a shape of a triangle with two inwards-recessed sides.

Optionally, three corners of the triangle of the section of the internal core layer are all round corners.

In this solution, the plurality of grid line sets are disposed at the cell, and the grid lines between the grid line sets are disconnected from each other, which can save an amount of grid line paste for fabricating the grid lines, and costs. In addition, compared with continuous grid lines, the disconnected grid lines between the grid line sets reduce shielding of the cell, and increase a light absorption area of the cell, thereby improving the performance of the cell.

In this solution, the number of the ribbons is designed to be greater than 28 and less than or equal to 78, which is increased compared with the number of ribbons in an existing cell. For the cell of the same area, an increase in the number of the ribbons will lead to a decrease in the distance between the ribbons, thereby shortening a motion path of carriers on the grid lines, and decreasing carrier consumption.

Based on the detailed description of specific embodiments of the present disclosure with reference to the accompanying drawings, those skilled in the art will have a better understanding of the above and other objectives, advantages, and features of the present disclosure.

BRIEF DESCRIPTION OF THE DRAWINGS

Some specific embodiments of the present disclosure will be described in detail by way of example rather than limitation below with reference to the accompanying drawings. The same reference signs in the accompanying drawings indicate the same or similar components or parts. It should be understood by those skilled in the art that these drawings are not necessarily drawn to scale. In the drawings.

DESCRIPTION OF REFERENCE SIGNS solar cell—100; cell—10; grid line—11; ribbon—20; special-shaped segment—21; flat segment 22; internal core layer—23; and external plating—24.

DETAILED DESCRIPTION OF THE INVENTION

In the description of this embodiment, it is to be understood that the orientations or positional relationships indicated by the terms "length", "width", "height", "up", "down", "left", "right", "vertical", "horizontal", "bottom", "inside", "outside", etc. are based on the orientations or positional relationships shown in the accompanying drawings, merely for conveniently describing the present disclosure and simplifying the description, rather than indicating or implying that the apparatus or element referred to must have a particular orientation or be constructed and operated in a particular orientation, and therefore cannot be understood as limitations to the present disclosure.

Figure 3:
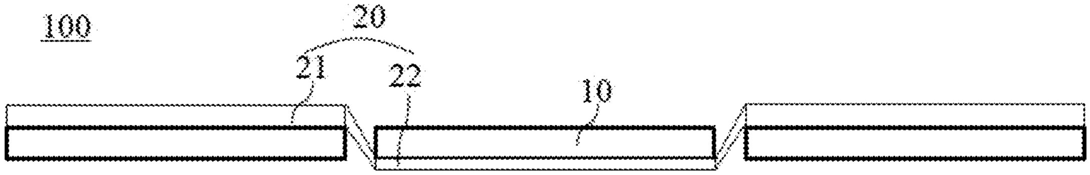
FIG. 3 is a schematic side view of a solar cell according to a specific embodiment of the present disclosure.
Figure 4:
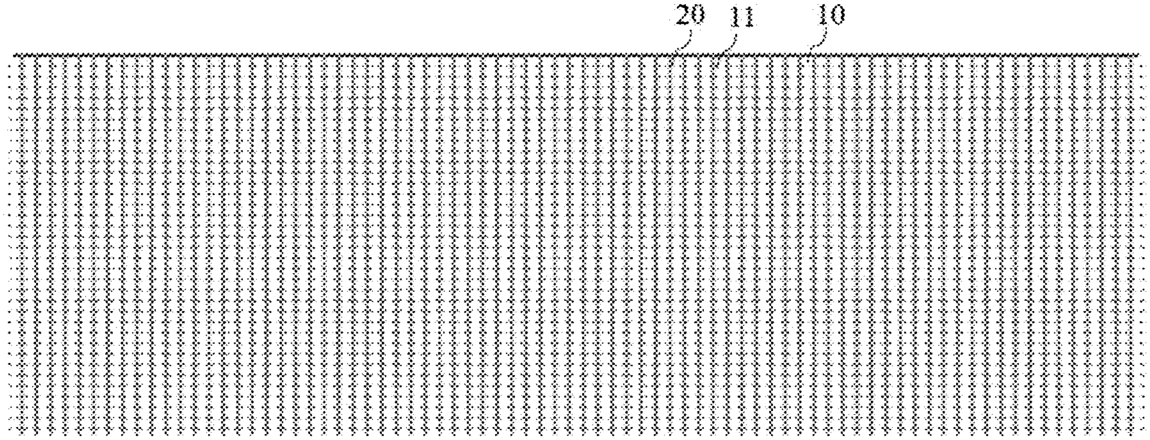
FIG. 4 is a schematic structural diagram of cells and ribbons according to a specific embodiment of the present disclosure.

As a specific embodiment of the present disclosure, as shown in FIG. 3, this embodiment provides a solar cell. The solar cell 100 may include a plurality of cells 10 and a plurality of ribbons 20. Each cell 10 includes a plurality of grid line sets arranged side by side along a first preset direction. As shown in FIG. 4, each grid line set may include a plurality of grid lines 11 of a preset length arranged in parallel along a second preset direction, and the grid lines 11 in two adjacent grid line sets are disconnected. The first preset direction is perpendicular to the second preset direction. Each ribbon 20 connects the plurality of cells 10 to one another in series. Each ribbon 20 is soldered to all the grid lines 11 in one grid line set of one cell 10.

Specifically, in this embodiment, the plurality of grid line sets are disposed at the cell 10, and the grid lines between the grid line sets are disconnected from each other, which can save an amount of paste for fabricating the grid lines 11, and costs. In addition, compared with continuous grid lines, the disconnected grid lines 11 between the grid line sets reduce shielding of the cell 10, and increase a light absorption area of the cell 10, thereby improving the performance of the cell 10.

As a specific embodiment of the present disclosure, in this embodiment, the number of the grid line sets on each cell 10 is the same as the number of the ribbons 20.

Specifically, the number of the ribbons 20 at each cell 10 is greater than 28 and less than or equal to 78.

In this solution, the number of the ribbons 20 is designed to be greater than 28 and less than or equal to 78, which is increased compared with the number of ribbons in an existing cell. For the cell of the same area, an increase in the number of the ribbons will lead to a decrease in the distance between the ribbons, thereby shortening a motion path of carriers on the grid lines, and decreasing carrier consumption.

In addition, since the grid lines in this embodiment are disconnected grid lines 11, a balance is formed between a decrease in shielding of the cell 10 due to disconnection of the grid lines 11 and an increase in shielding of the cell 10 due to an increase in the number of the ribbons 20, so that a transfer path of the carriers on the grid lines 11 is shortened without change of shielding, thereby improving the performance of the cell.

As a specific embodiment of the present disclosure, in this embodiment, the ribbon 20 is soldered in middles of the grid lines 11 in the corresponding grid line set. Such design can ensure that the performance of the cell 10 at different positions is basically consistent.

Figure 1:
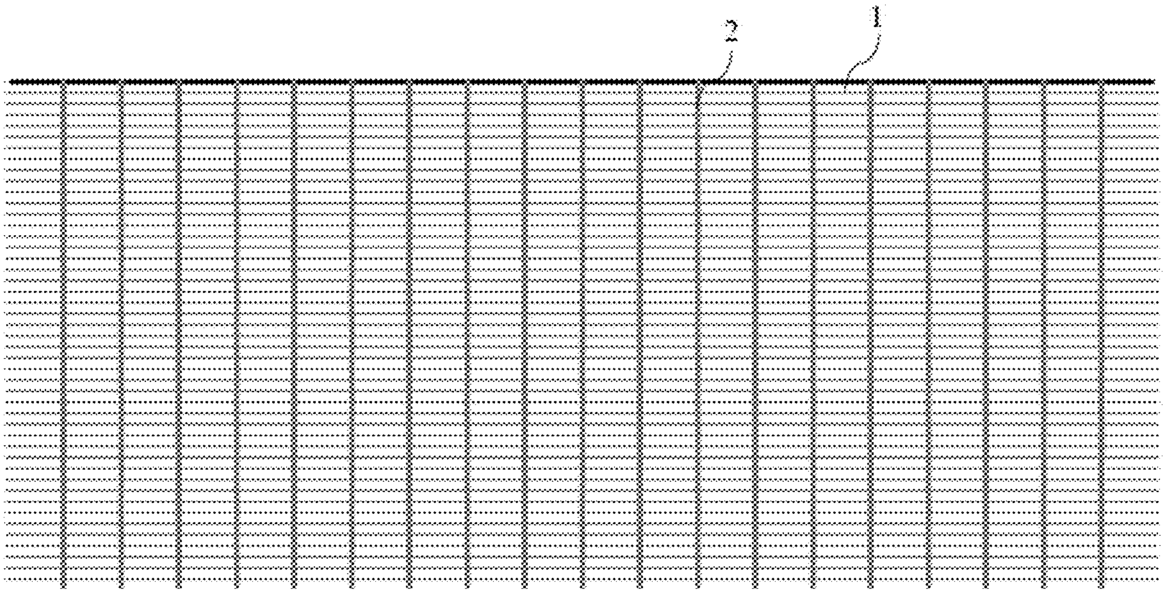
FIG. 1 is a schematic structural diagram of cells and ribbons in the prior art.

Specifically, taking conventional cells with a size of 210*105 mm as an example, a diagram of 28 ribbons on the conventional cells is as shown in FIG. 1 under the condition of continuous grid lines. A schematic diagram of 78 ribbons designed on the conventional cells with the size of 210*105 mm is as shown in FIG. 3. A distance between two adjacent ribbons in the 28 ribbons on the conventional cells is 7.4 mm (circular ribbons with a diameter of 0.25 mm are used), and a distance between two adjacent ribbons in the 78 ribbons on the cells is 2.6 mm (special-shaped ribbons in a shape of an equilateral triangle with a base of 0.15 mm), thus greatly shortening an electron transfer path, reducing an electron loss, and improving module power.

Figure 2:
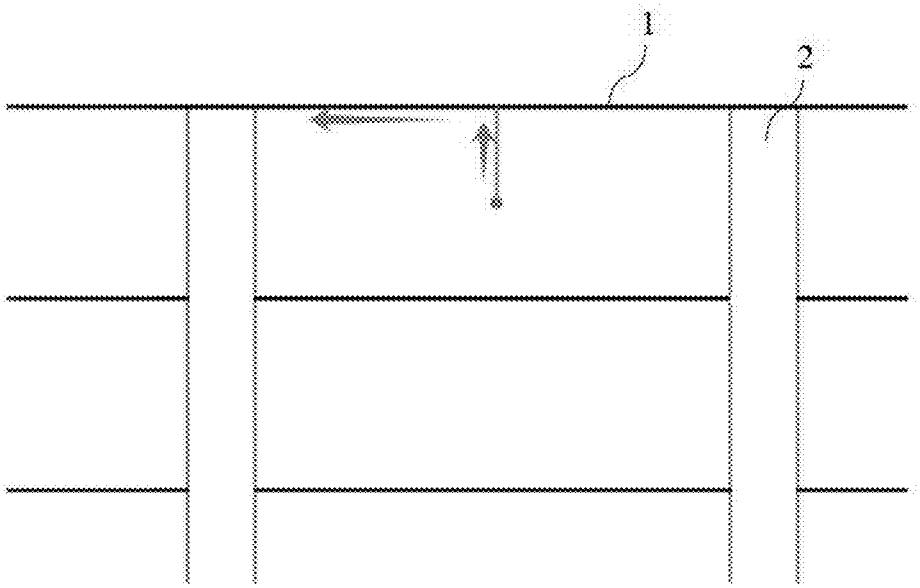
FIG. 2 is a schematic diagram of flowing of carriers on cells, ribbons, and grid lines in the prior art.

In addition, taking conventional cells with a size of 210*105 mm as an example, a flow path of carriers on the cells using a conventional number of 28 ribbons is as shown in FIG. 2 under the condition of disconnected grid lines, where a center of circle is a point on the cell farthest from a fine grid, and an arrow represents a motion path (cell-fine grid-ribbon) of the carriers on the cell.

Figure 5:
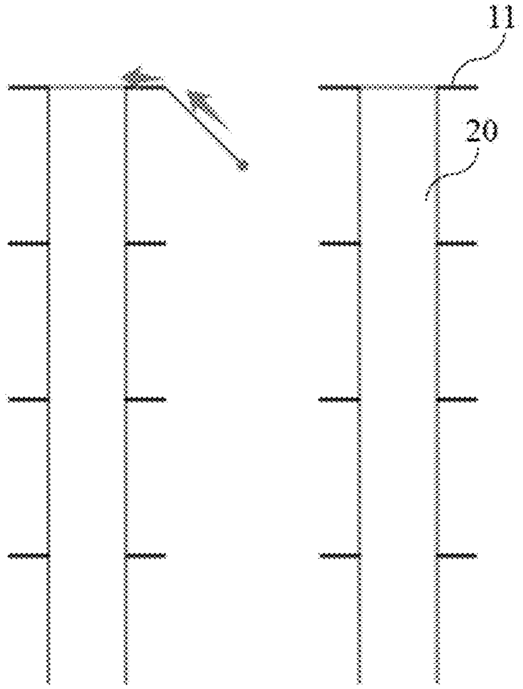
FIG. 5 is a schematic diagram of flowing of carriers on cells, ribbons, and grid lines according to a specific embodiment of the present disclosure.

The cells using 78 ribbons are as shown in FIG. 5, where a center of circle is a point on the cell farthest from a fine grid, and an arrow represents a motion path (cell-fine grid-ribbon) of the carriers on the cell. By designing the number of the ribbons and the arrangement of the grid lines, the discontinuous grid lines greatly shorten the transfer path of the carriers on the grid lines and reduce the carrier consumption while ensuring that the motion path of the carriers of the grid lines on the cells is equal to that of the carriers of the conventional ribbons on the cells.

As a specific embodiment of the present disclosure, as shown in FIG. 3, in this embodiment, the ribbon 20 is a special-shaped ribbon, the special-shaped ribbon includes a special-shaped segment 21 and a flat segment 22, and the special-shaped segment 21 is soldered to the grid line set.

Figure 6:
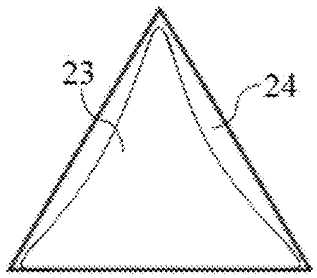
FIG. 6 is a schematic sectional view of a special-shaped segment of a ribbon according to a specific embodiment of the present disclosure.

As a specific embodiment of the present disclosure, as shown in FIG. 6, in this embodiment, a section of the special-shaped segment 21 of the special-shaped ribbon is in a shape of a triangle, and a base of the triangle is soldered to the grid line.

Specifically, in this embodiment, the section of the special-shaped segment 21 of the special-shaped ribbon is in the shape of the triangle, so that all light directly incident on the ribbon can be secondarily reflected onto the cell, thereby improving the light utilization, and increasing the module power.

Specifically, in this embodiment, the triangle is an equilateral triangle. A side length of the equilateral triangle is 0.15 mm.

As a specific embodiment of the present disclosure, as shown in FIG. 6, in this embodiment, the ribbon 20 may include an internal core layer 23 and an external plating 24. A section of the internal core layer 23 is formed in a shape of a triangle with two inwards-recessed sides. In this way, an outer edge of the external plating is a smooth surface when the external plating 24 is plated on the internal core layer. In this embodiment, the internal core layer 23 may be a copper core layer. The external plating 24 may be made of tin or tin alloy.

As a specific embodiment of the present disclosure, in this embodiment, three corners of the triangle of the section of the internal core layer 23 are all round corners. The three corners of the triangle are formed into the round corners, which can prevent stress concentration caused by excessively sharp angles from damage to the cell or an operator.

By now, it should be recognized by those skilled in the art that while the multiple exemplary embodiments of the present disclosure have been shown and described in detail herein, many other variations or modifications conforming to the principle of the present disclosure may still be directly determined or derived from the content of the present disclosure without departing from the spirit and scope of the present disclosure. Therefore, the scope of the present disclosure should be understood and recognized as covering all such other variations or modifications.

What is claimed is:

1. A solar cell, comprising:

a plurality of cells, wherein each of the cells comprises a plurality of grid line sets arranged side by side along a first preset direction, each of the grid line sets comprises a plurality of grid lines of a preset length arranged in parallel along a second preset direction, and the grid lines in adjacent two of the grid line sets are disconnected, wherein the first preset direction is perpendicular to the second preset direction; and a plurality of ribbons, wherein each of the ribbons connects the plurality of cells to one another in series and is soldered to all the grid lines in one of the grid line sets of one of the cells, the ribbon comprises an internal core layer and an external plating, a section of the internal core layer is formed in a shape of a triangle, and three corners of the triangle of the section of the internal core layer are all round corners.

2. The solar cell according to claim 1, wherein a number of the grid line sets on each of the cells is the same as a number of the ribbons.

3. The solar cell according to claim 2, wherein the number of the ribbons at each of the cells is greater than 28 and less than or equal to 78.

4. The solar cell according to claim 1, wherein the ribbon is soldered in middles of the grid lines in the corresponding grid line set.

5. The solar cell according to claim 1, wherein the ribbon is a special-shaped ribbon, the special-shaped ribbon comprises a special-shaped segment and a flat segment, and the special-shaped segment is soldered to the grid line set.

6. The solar cell according to claim 5, wherein a section of the special-shaped segment of the special-shaped ribbon is in the shape of the triangle, and a base of the triangle is soldered to the grid line.

7. The solar cell according to claim 6, wherein the triangle is an equilateral triangle; and a side length of the equilateral triangle is 0.15 mm.

8. The solar cell according to claim 3, wherein the number of the ribbons is 78, and the ribbon is a special-shaped ribbon with a cross-section of an equilateral triangle having a base side length of 0.15 mm.

9. The solar cell according to claim 8, wherein when a size of each of the cells is 210 mm×105 mm, a distance between two adjacent ribbons is 2.6 mm.

* * * * *